United States Patent
Zhao et al.

(10) Patent No.: US 6,984,577 B1
(45) Date of Patent: Jan. 10, 2006

(54) DAMASCENE INTERCONNECT STRUCTURE AND FABRICATION METHOD HAVING AIR GAPS BETWEEN METAL LINES AND METAL LAYERS

(75) Inventors: Bin Zhao, Irvine, CA (US); Maureen R. Brongo, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/665,422

(22) Filed: Sep. 20, 2000

(51) Int. Cl.
*H01L 21/4763* (2006.01)

(52) U.S. Cl. .................. 438/619; 438/411; 438/421; 438/422

(58) Field of Classification Search .......... 438/618, 438/619, 620, 622, 623, 624, 411–412, 421–422; 257/522, 758, 759, 760
See application file for complete search history.

(56) References Cited

U.S. PATENT DOCUMENTS

| | | | | |
|---|---|---|---|---|
| 5,708,303 A | * | 1/1998 | Jeng | 257/758 |
| 6,064,118 A | * | 5/2000 | Sasaki | 257/758 |
| 6,130,151 A | * | 10/2000 | Lin et al. | 438/619 |
| 6,159,840 A | * | 12/2000 | Wang | 438/618 |
| 6,177,329 B1 | * | 1/2001 | Pang | 438/400 |
| 6,184,121 B1 | * | 2/2001 | Buchwalter et al. | 438/622 |
| 6,204,165 B1 | * | 3/2001 | Ghoshal | 438/619 |
| 6,211,057 B1 | * | 4/2001 | Lin et al. | 438/619 |
| 6,211,561 B1 | * | 4/2001 | Zhao | 257/522 |
| 6,265,321 B1 | * | 7/2001 | Chooi et al. | 438/725 |
| 6,297,125 B1 | * | 10/2001 | Nag et al. | 438/421 |
| 6,350,672 B1 | * | 2/2002 | Sun | 438/619 |
| 6,492,256 B2 | * | 12/2002 | Lee et al. | 438/619 |
| 6,509,623 B2 | * | 1/2003 | Zhao | 257/522 |
| 2002/0016058 A1 | * | 2/2002 | Zhao | 438/619 |
| 2002/0127844 A1 | * | 9/2002 | Grill et al. | 438/622 |

FOREIGN PATENT DOCUMENTS

EP          475646 A2 *  3/1992

* cited by examiner

*Primary Examiner*—Jerome Jackson
*Assistant Examiner*—José R. Diaz
(74) *Attorney, Agent, or Firm*—Farjami & Farjami LLP

(57) ABSTRACT

A damascene interconnect that reduces interconnect intra-layer capacitance and/or inter-layer capacitance is provided. The damascene interconnect structure has air gaps between metal lines and/or metal layers. The interconnect structure is fabricated to a via level through a processing step prior to forming contact vias, then one or more air gaps are formed into the damascene structure so that the air gaps are positioned between selected metal lines. A sealing layer is then deposited over the damascene structure to seal the air gaps.

18 Claims, 15 Drawing Sheets

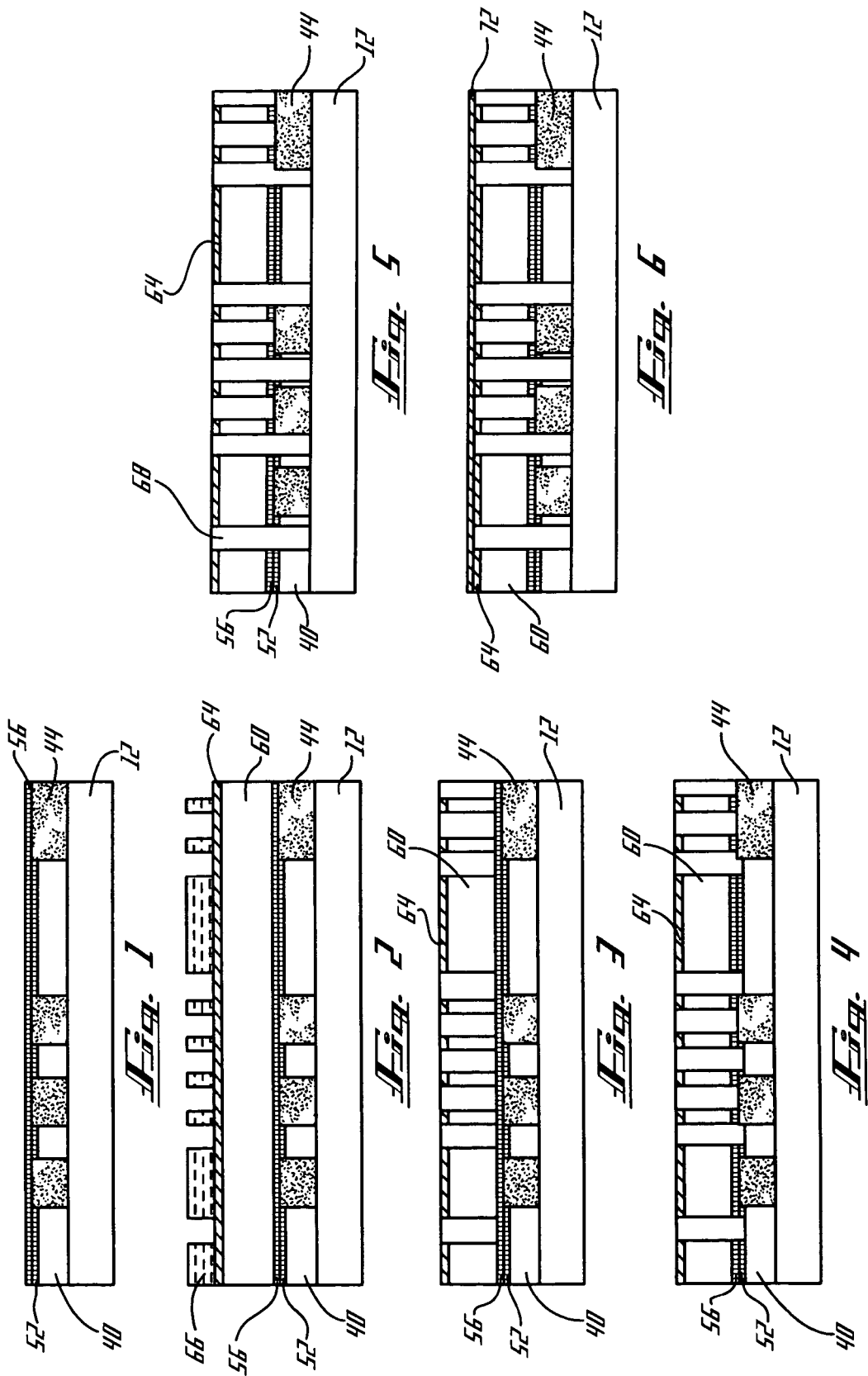

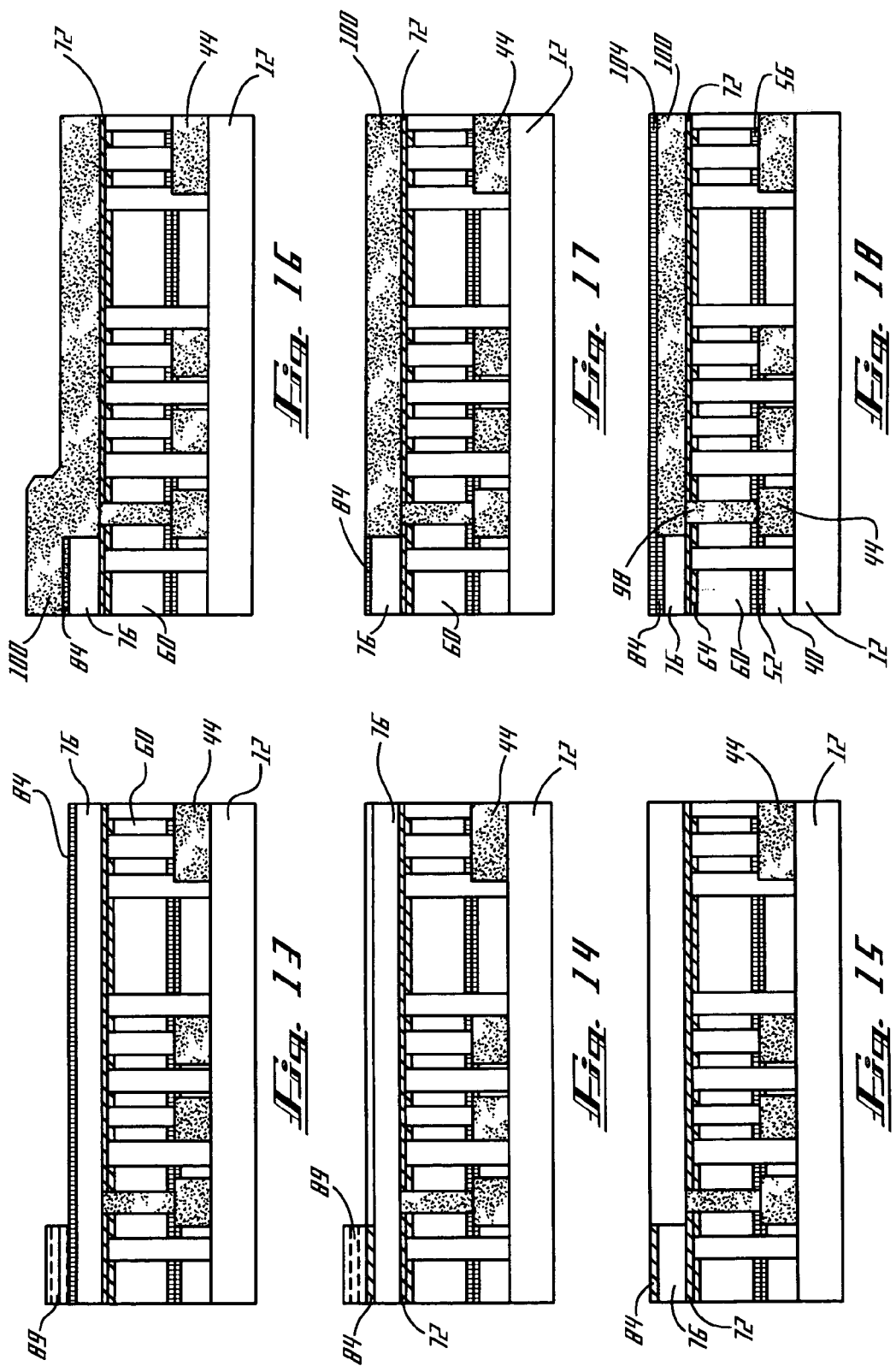

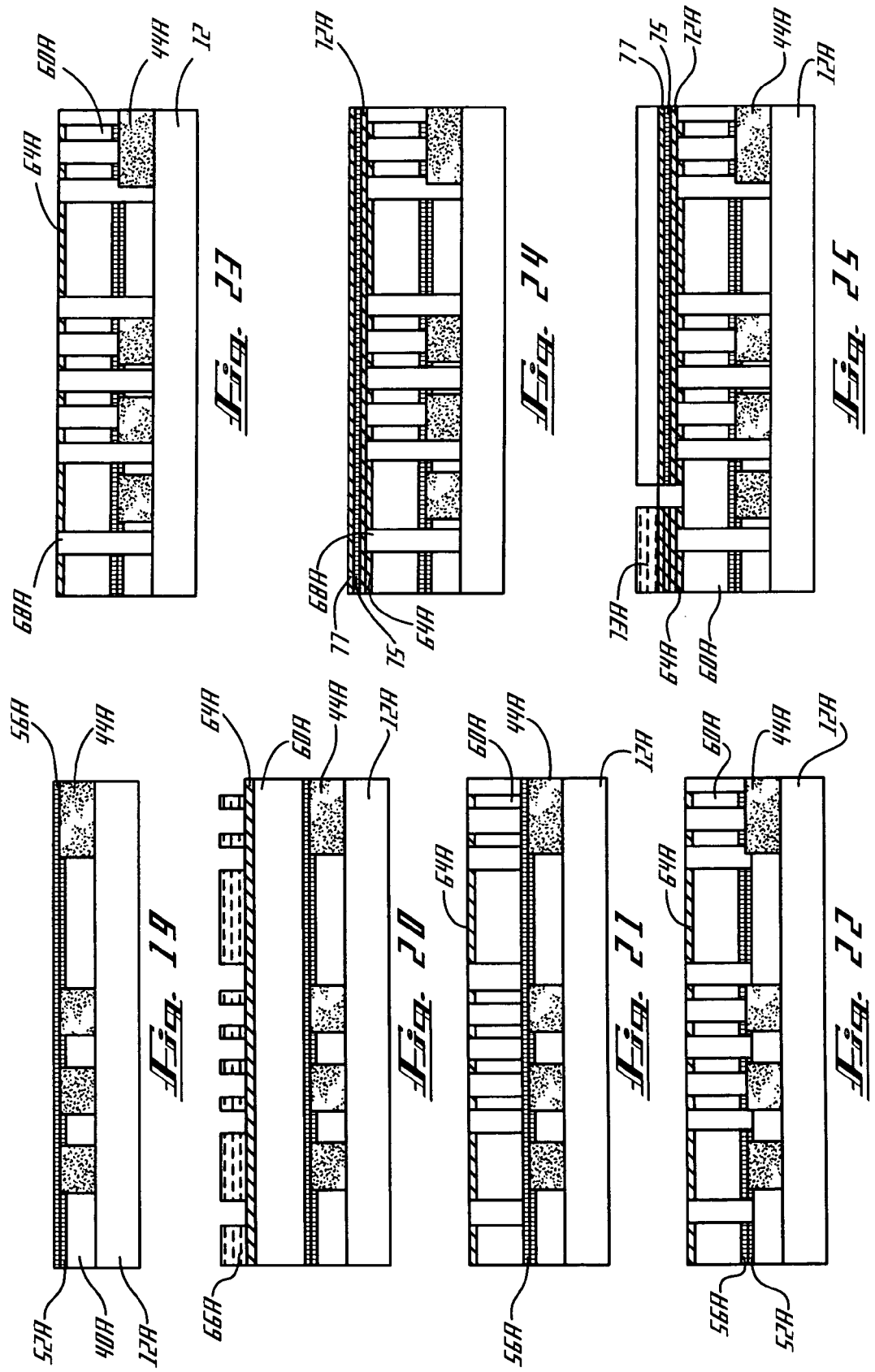

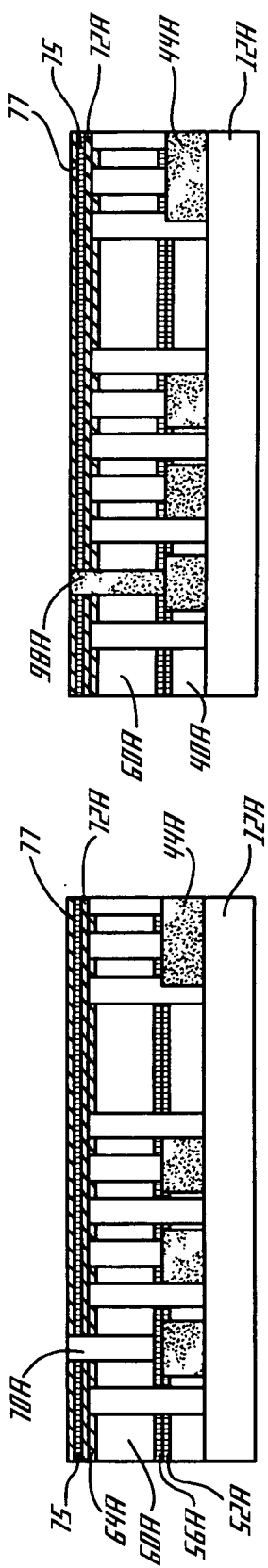
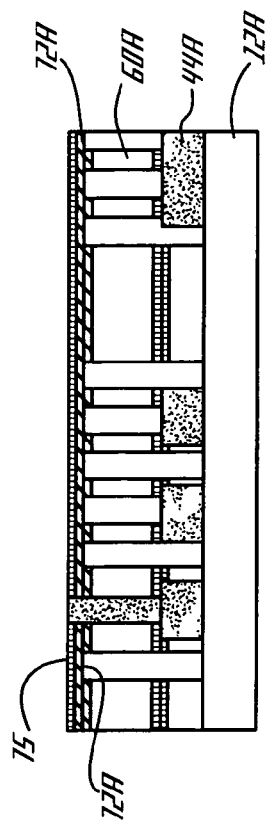
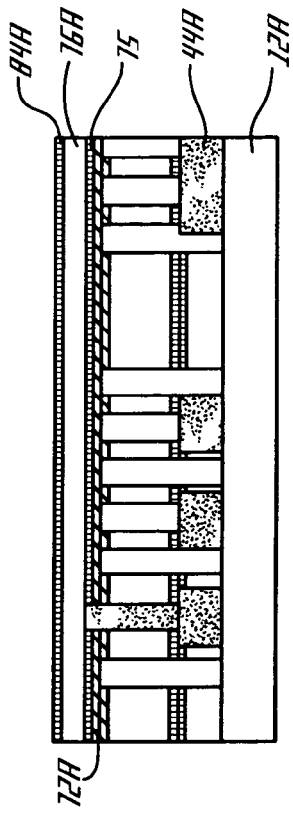
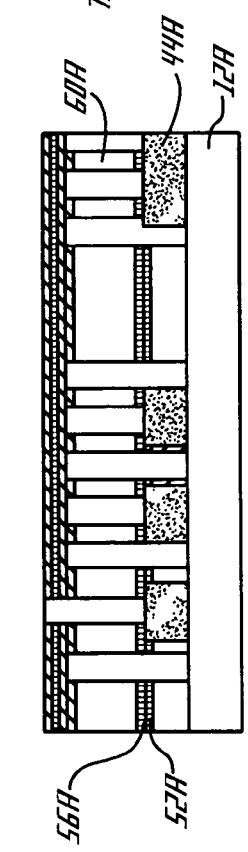
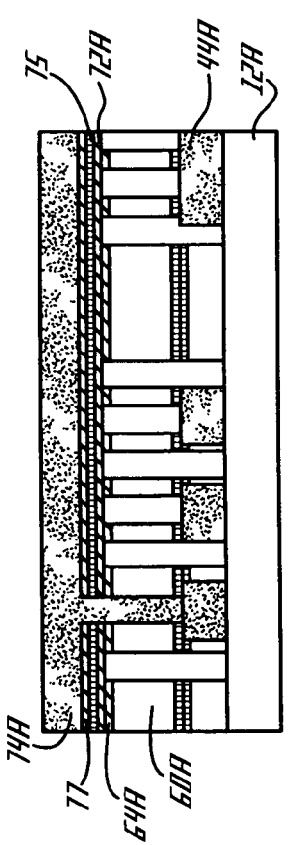

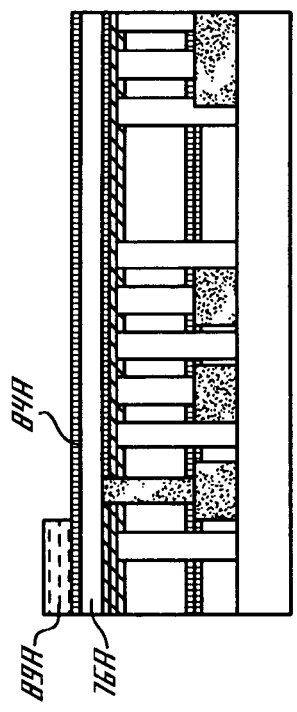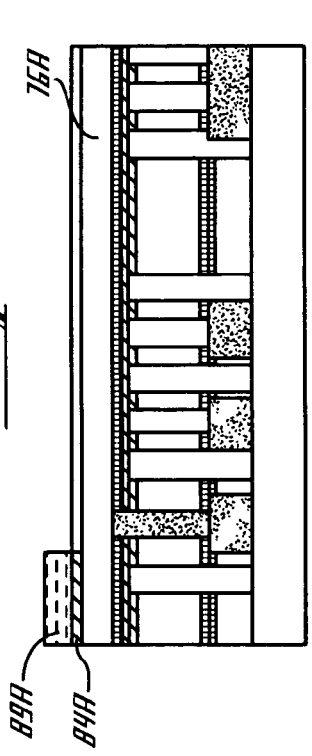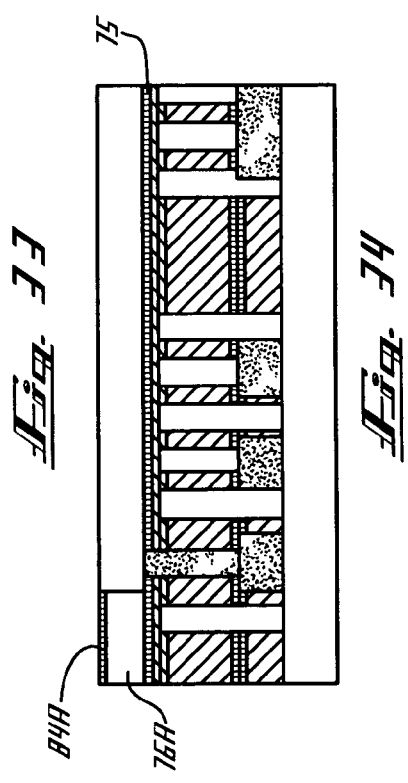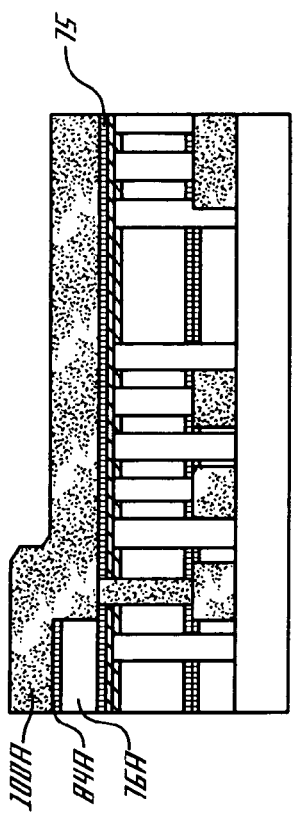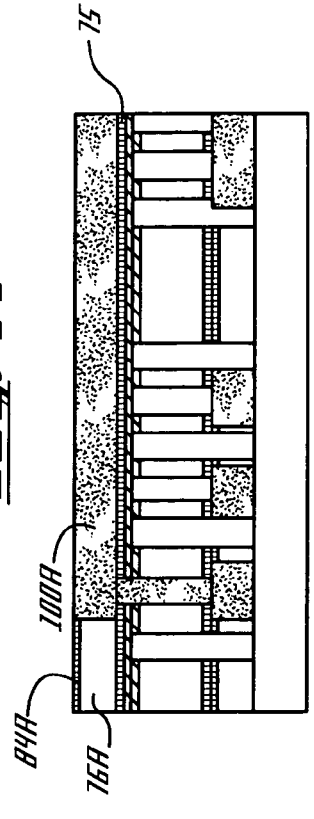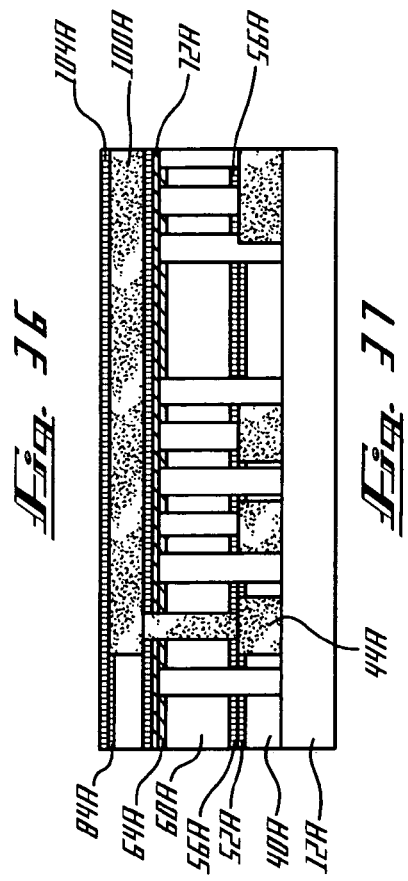

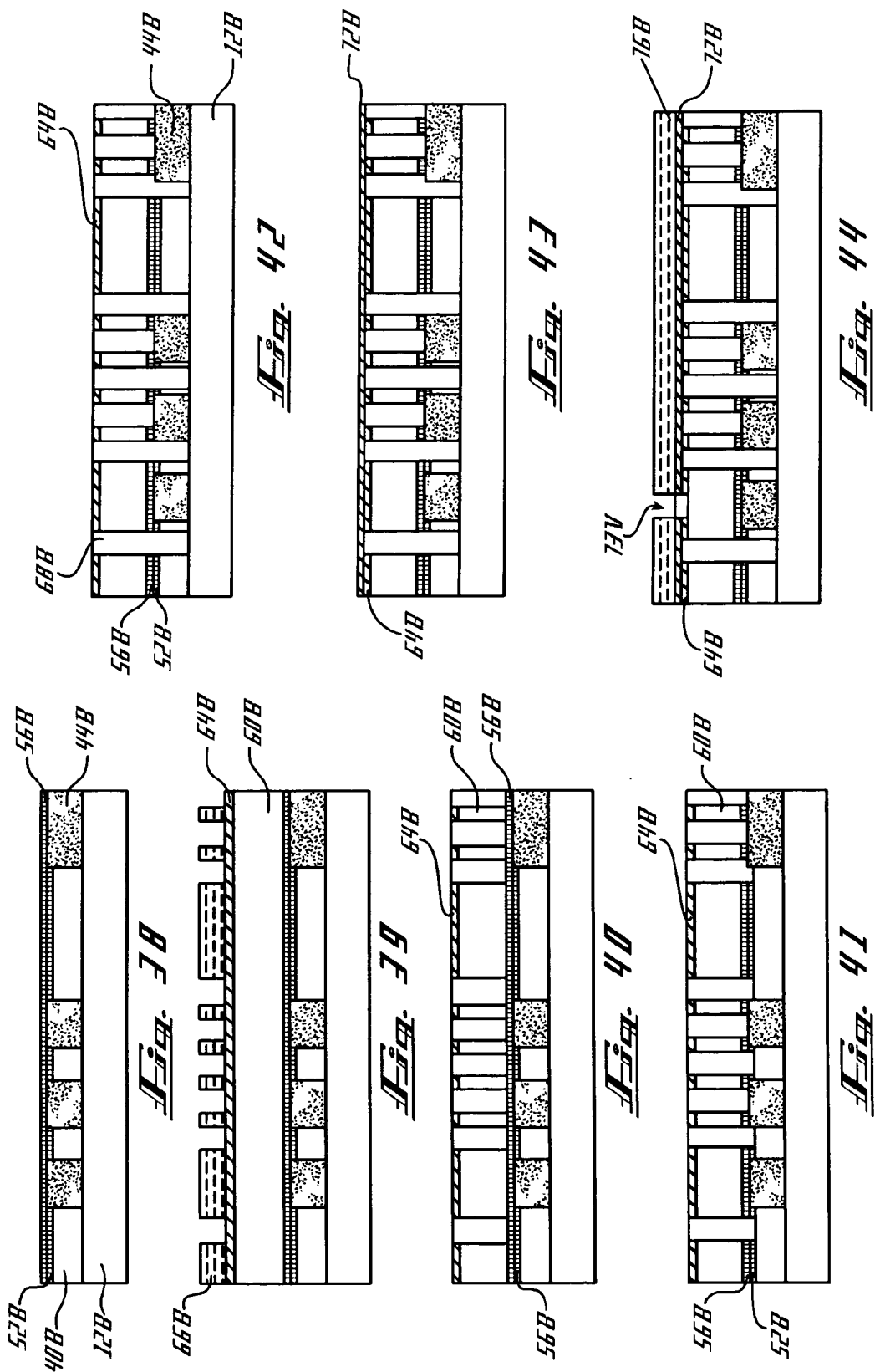

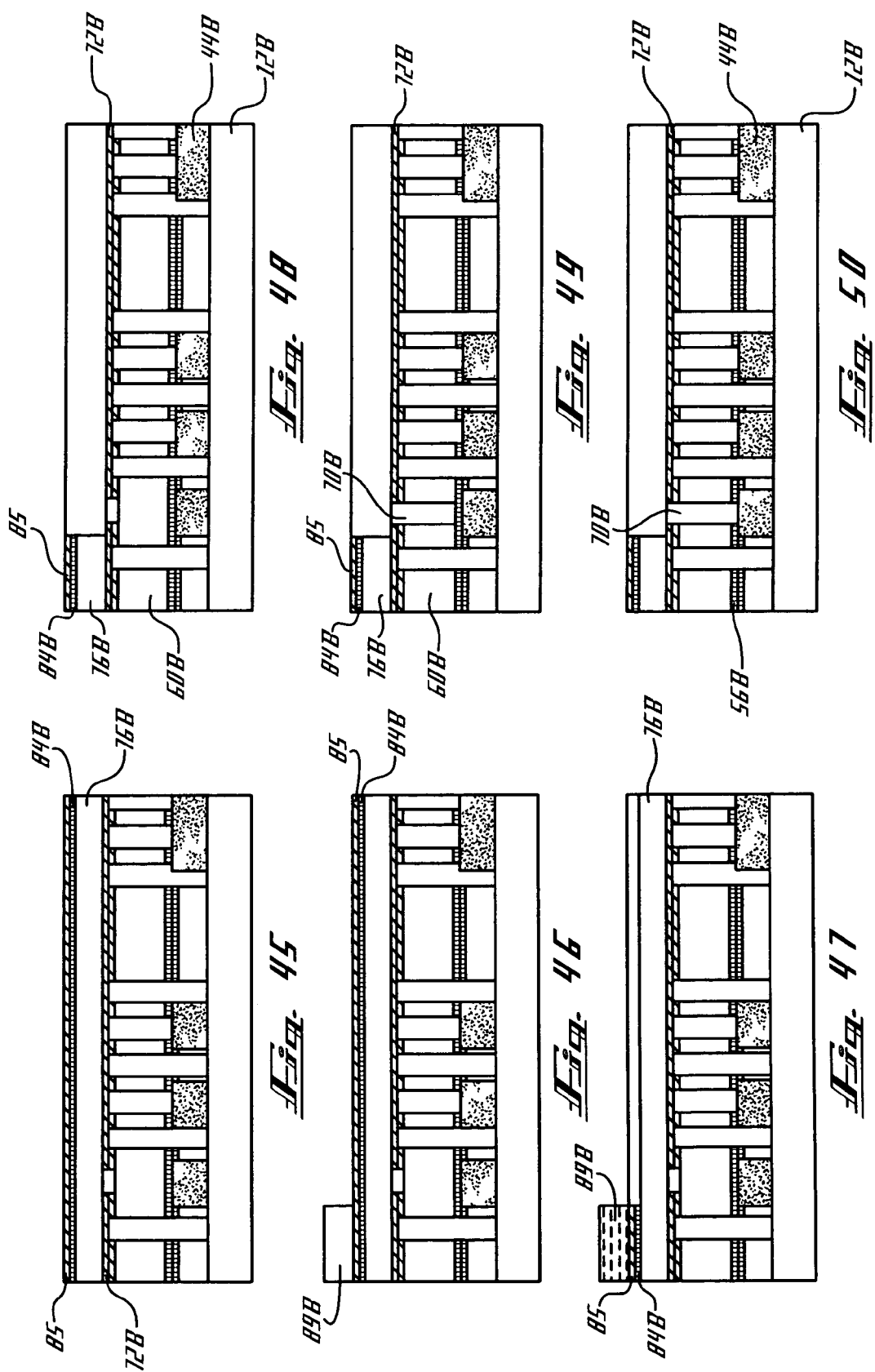

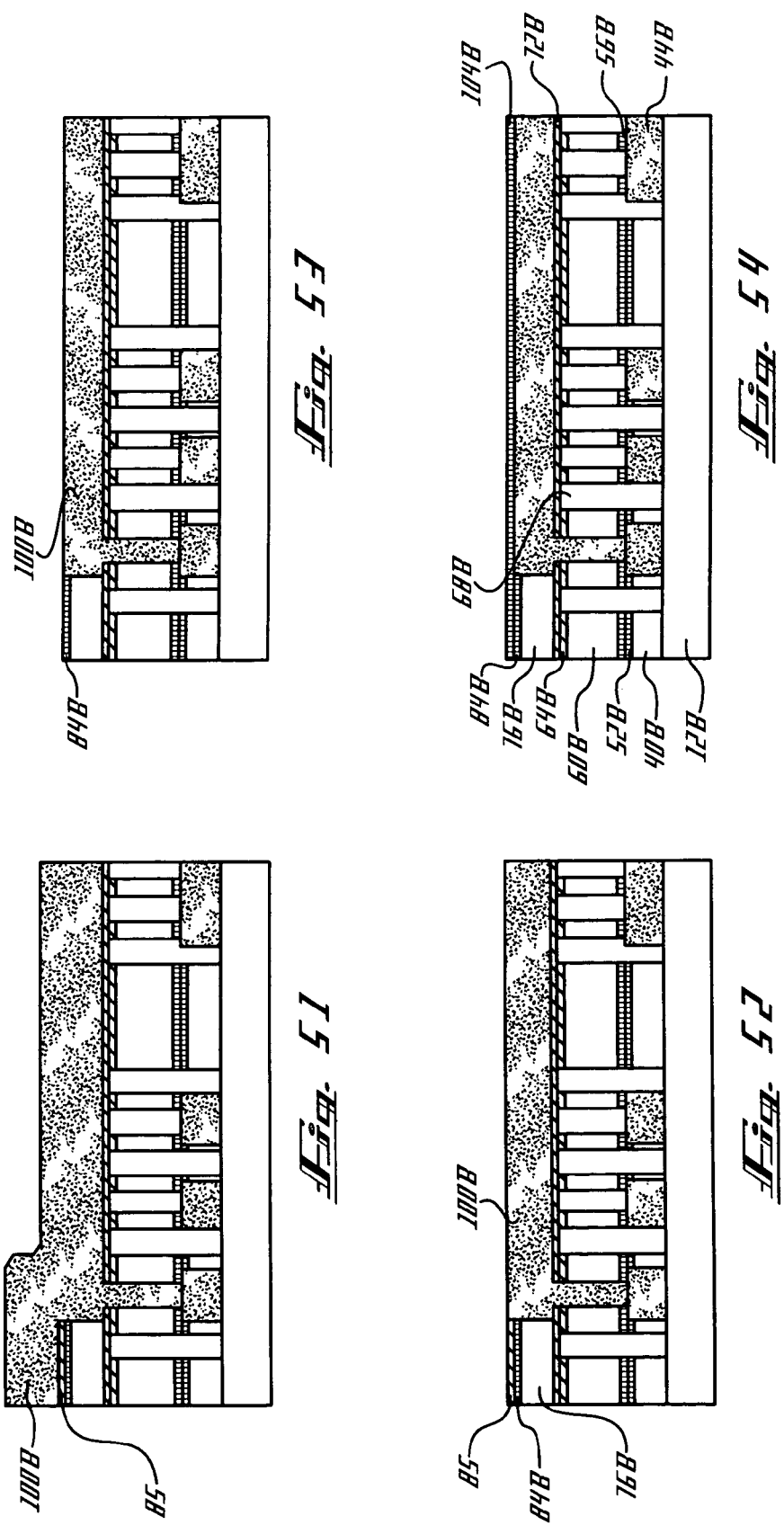

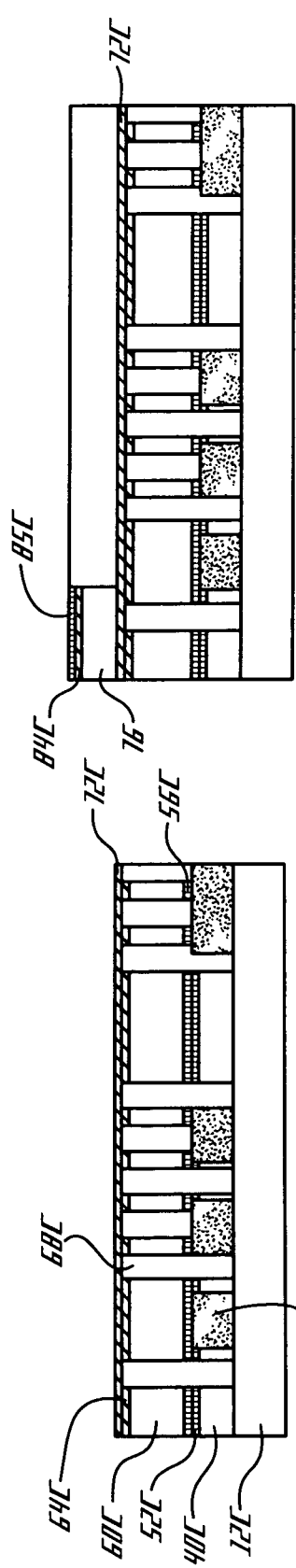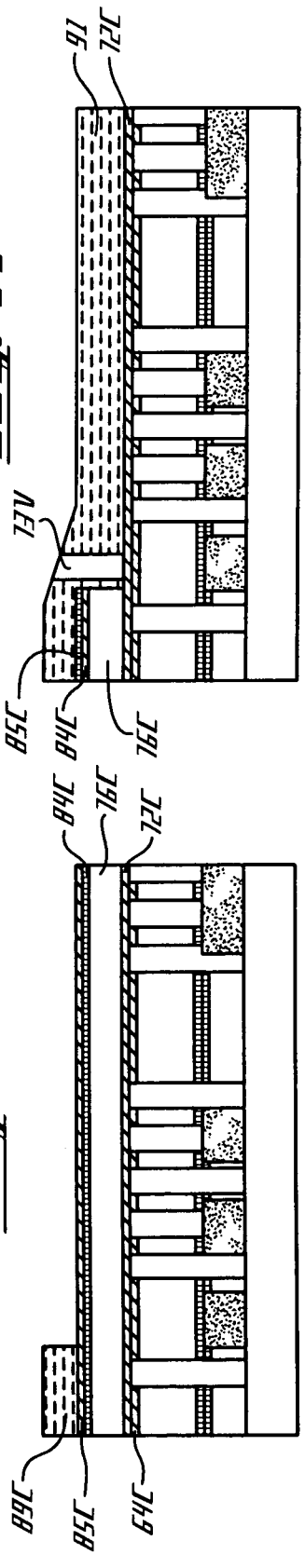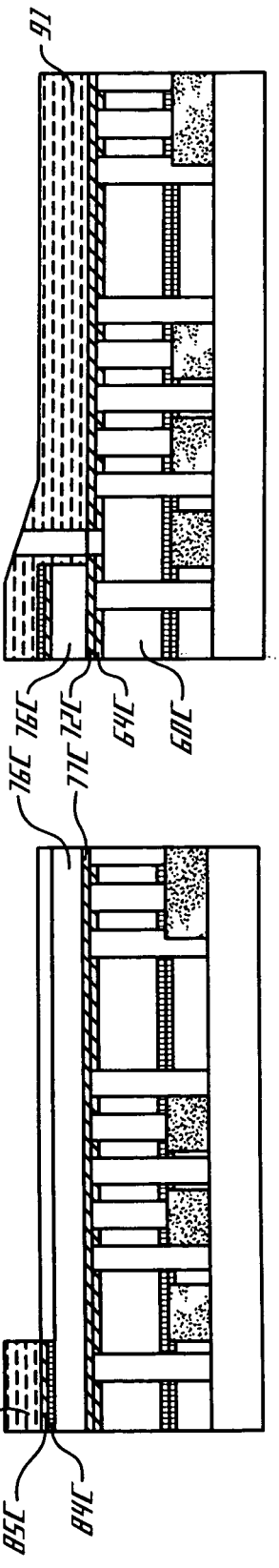

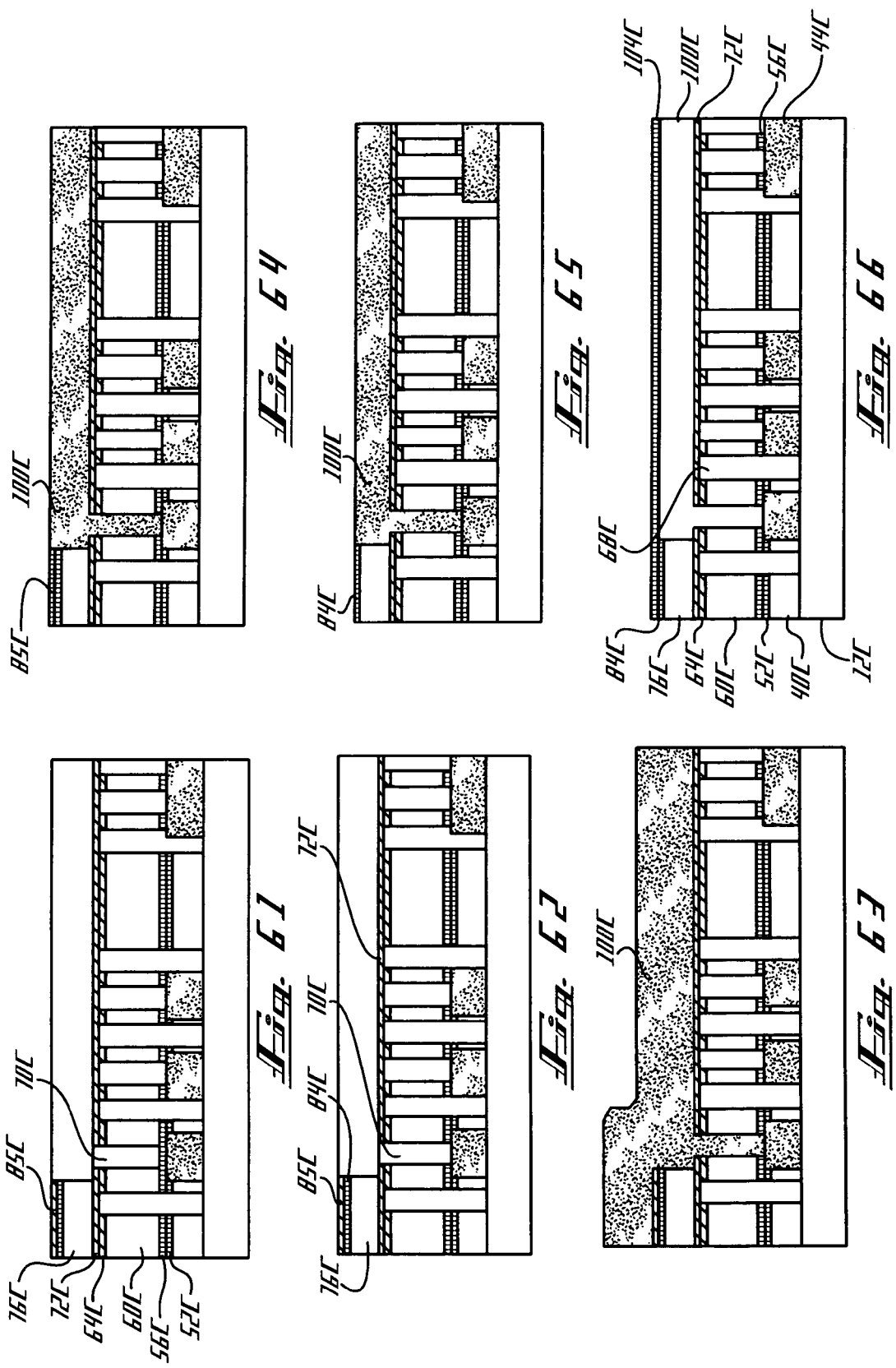

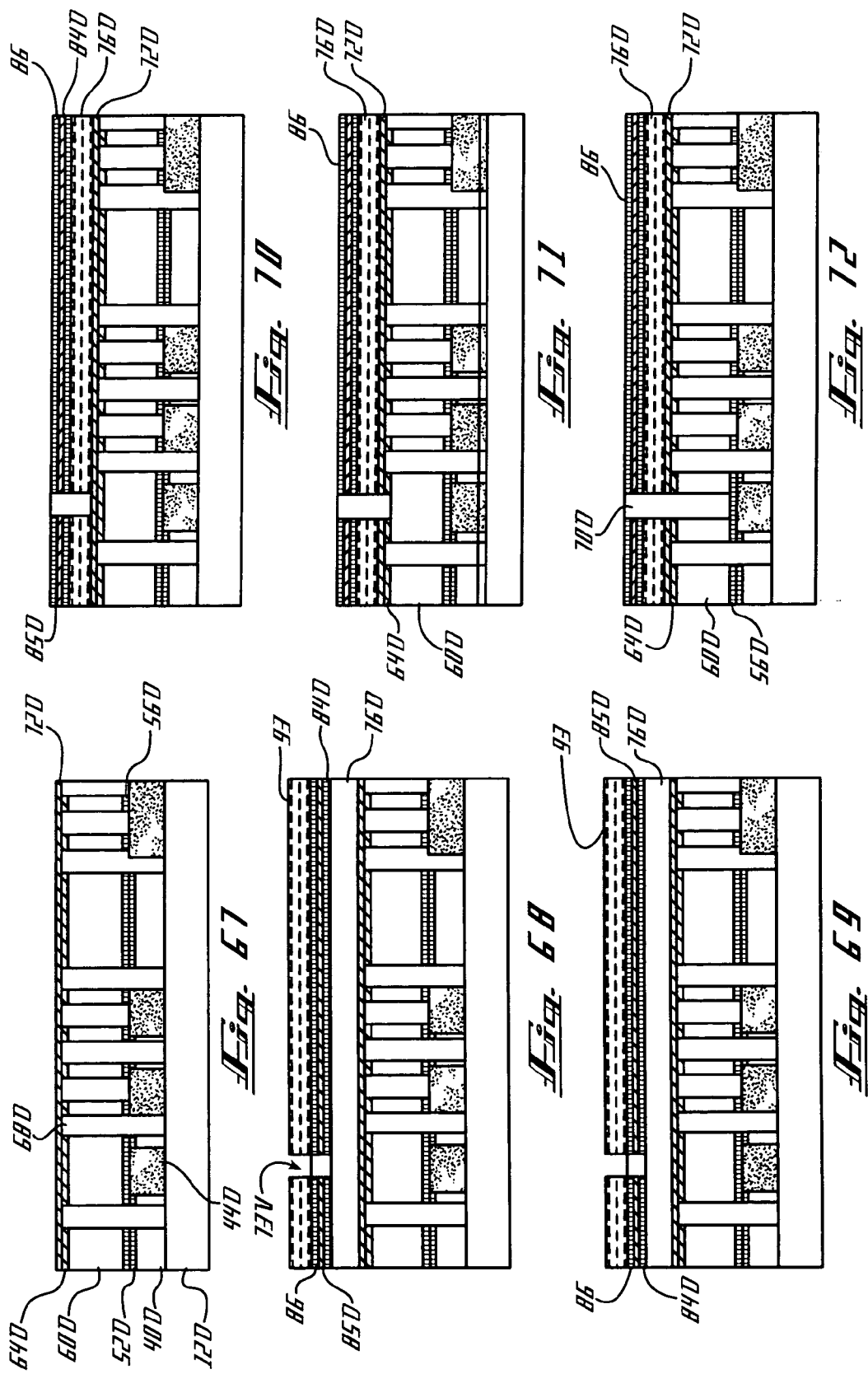

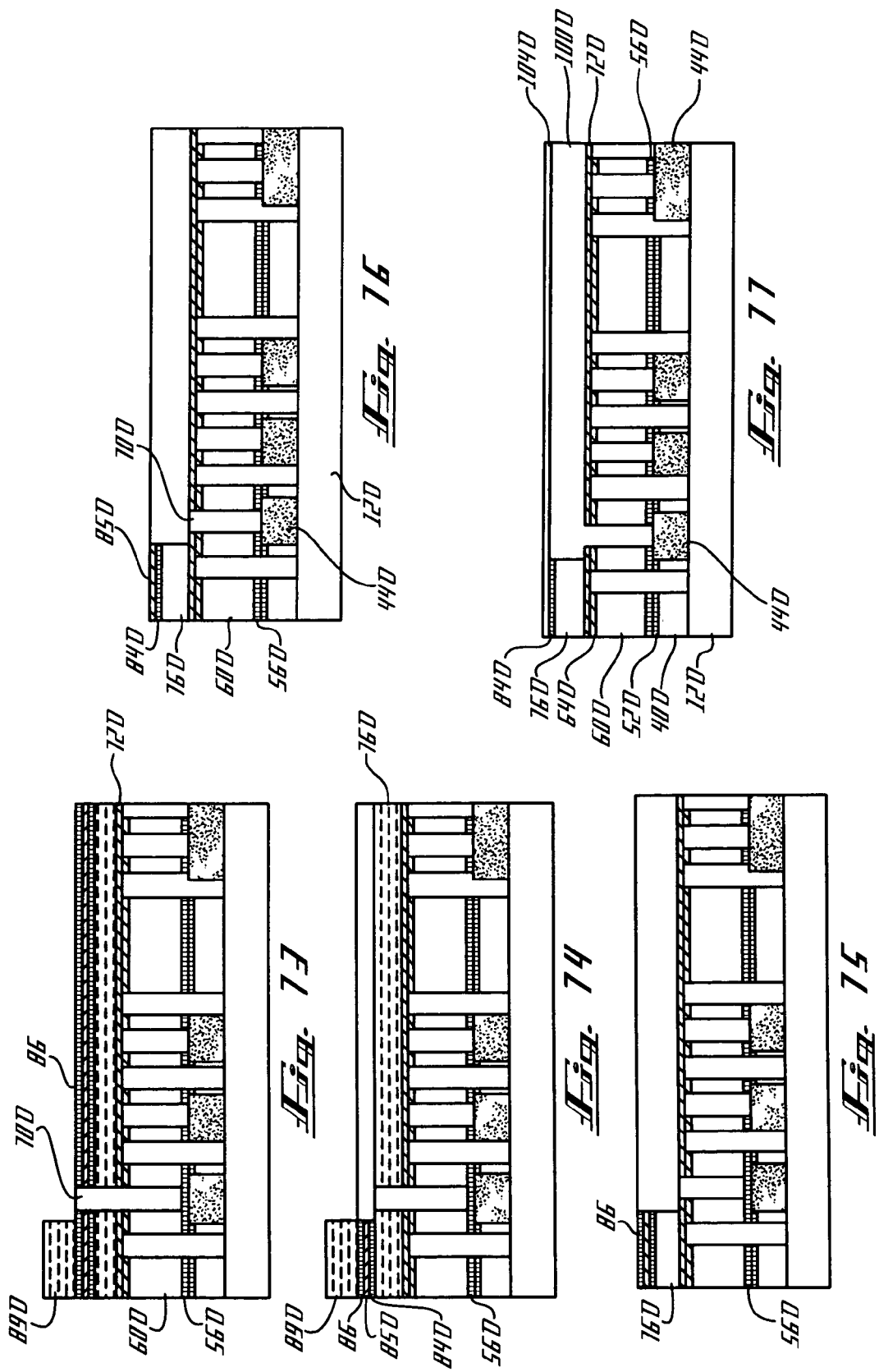

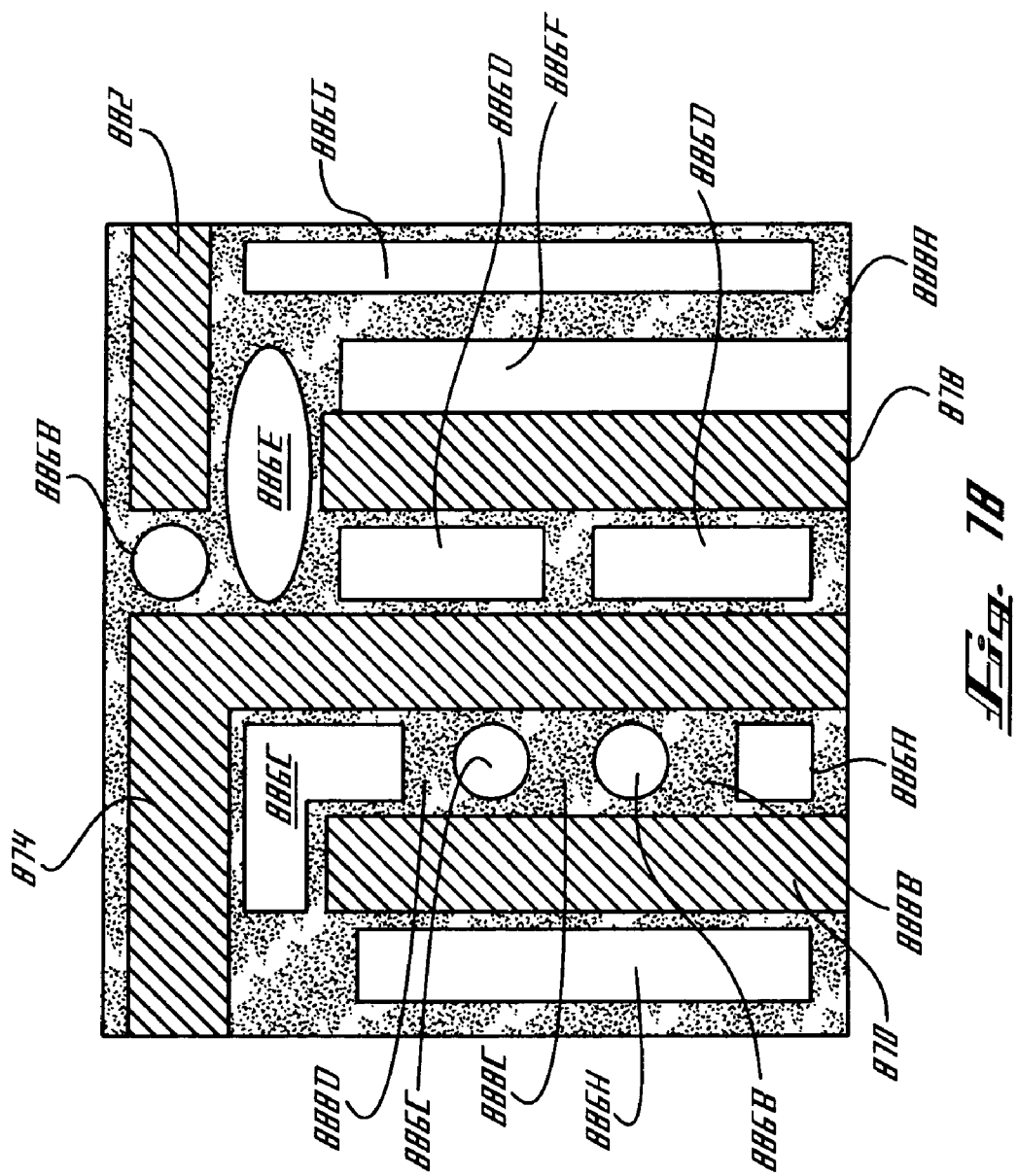

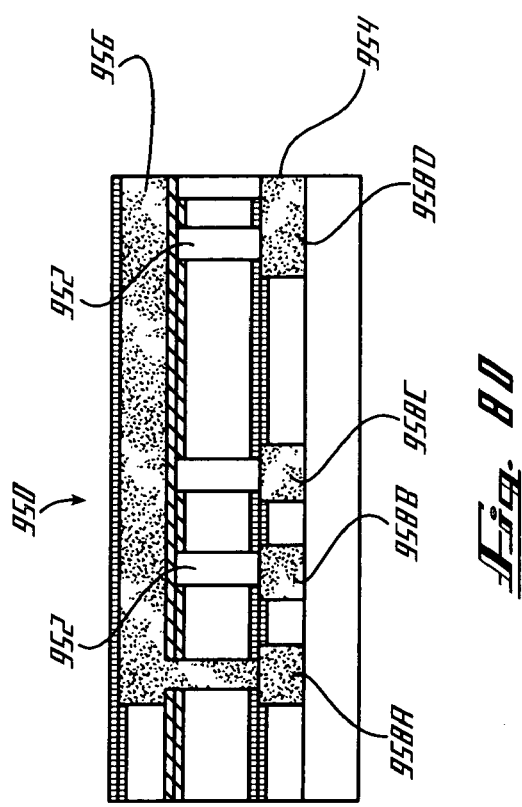
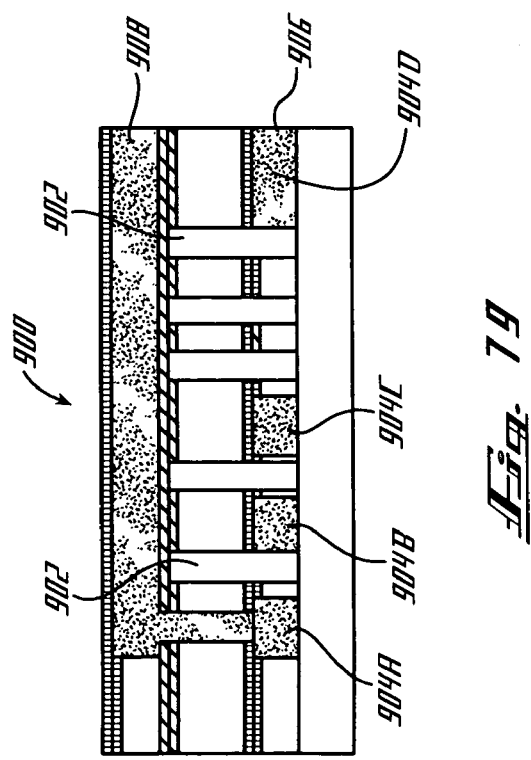

DAMASCENE INTERCONNECT STRUCTURE AND FABRICATION METHOD HAVING AIR GAPS BETWEEN METAL LINES AND METAL LAYERS

FIELD OF THE INVENTION

The present invention relates generally to semiconductor processing and more specifically to a damascene interconnect structure and fabrication method having air gaps between metal lines and metal layers.

BACKGROUND OF THE INVENTION

1. Overview of the Damascene Architecture

Damascene processing involves the formation of interconnect lines by first etching a trench or canal in a planar dielectric layer, and then filling that trench with metal, such as aluminum or copper. In dual damascene processing, another level is involved where a series of holes (contacts or vias) are etched and filled simultaneously with the trench by metal or metals. After filling, the excess metal outside the trenches is planarized and polished back by chemical mechanical polishing so that metal is only left within the holes and the trenches.

2. Advantages of Damascene Architecture

The main advantage of damascene processing is that it eliminates the need for metal etch. This advantage is important, especially for metals, such as copper, that are difficult to pattern by conventional plasma etching. A second advantage of damascene processing is that it eliminates the need for dielectric gap fill, which is also a great challenge for the industry, especially as structures migrate to smaller dimensions. A third advantage is that damascene processing provides better or improved lithographic overlay tolerance, thereby making it possible to achieve higher interconnect packing density.

3. Overview of Issues Relating to ULSI Integrated Circuits

Those involved with the manufacture of high performance ultra-large scale integration (ULSI) integrated circuits must address and be sensitive to RC delay problems, cross-talk issues, and power dissipation.

RC delay is the signal propagation delay caused by charge and discharge of interconnect lines, which is related to the resistance R in metal lines and the capacitance C between metal lines. RC delay is undesirable because this delay adversely affects timing requirements and the performance of the circuit design by injecting uncertainty as to when a signal will be received or valid at a particular node in the circuit. Cross-talk is the signal interference between metal lines that can adversely affect signal integrity and signal strength. Power dissipation is the dynamic power drained by unwanted capacitance charge and discharge in a circuit.

It is apparent that RC delay problems, cross-talk issues, and power dissipation are significantly influenced by interconnect intra-layer capacitance (i.e., capacitance between metal lines within a metal layer) and interconnect inter-layer capacitance (i.e., capacitance between metal lines in two adjacent metal layers). Accordingly, reducing the intra-layer capacitance and inter-layer capacitance is important in reducing RC delay, cross-talk, and power dissipation in a circuit.

One approach to reduce interconnect capacitance is to utilize low dielectric constant materials (commonly referred to as "low-k" materials) in interconnect structures. The dielectric constant of these low-k materials is less than that of the conventional dielectric material $SiO_2$. Since capacitance between metal lines or layers depends directly on the dielectric constant of the material therebetween, reducing the dielectric constant reduces the capacitance. Porous materials, such as Xerogel, show promise as candidates for the low-k material because of its good thermal stability, low thermal expansion coefficient, and low dielectric constant. Unfortunately, the use of these porous materials has several disadvantages.

First, the deposition of porous materials is complicated and difficult to control. Second, the porous materials generally provide poor mechanical strength. Third, the porous materials generally provide poor thermal conductivity. Fourth, because of the porous nature of these materials, defining via holes or trenches with smooth vertical sidewall and bottom surfaces therein is a difficult, if not impossible, challenge. Smooth vertical sidewall and bottom surfaces facilitate the deposition of a continuous liner in subsequent process steps. A continuous liner is important because a non-continuous liner causes poor metal fill in the via holes or trenches and/or undesired metal diffusion (e.g., Cu diffusion) through the poor barrier liner into the dielectric layer that can lead to reliability problems and failure of the interconnection.

Another approach to reduce interconnect capacitance is to introduce air spaces between metal lines by intentionally poor-filling the gaps between the metal lines when depositing dielectric material used for isolation and mechanical support of the next metal layer. However, this approach suffers from several disadvantages. First, it is not possible to control the location of these air spaces since the location of these unfilled spaces is determined by the interconnect layout. Second, this approach does not address inter-layer capacitance since poor-filling only forms air spaces between metal lines in the same metal layer and not between metal layers. Third, this approach goes against the principle of completely filling gaps between metal lines for better process robustness and reliability. Fourth, it is not possible to control the volume of these air spaces, since the volume of these spaces is determined by the interconnect layout. Fifth, the air volume of these gaps is usually low, resulting in relatively large effective dielectric constant, which results in higher capacitance between metal lines.

Based on the foregoing, there remains a need for a damascene interconnect structure that has a low dielectric constant and that overcomes the disadvantages discussed previously.

SUMMARY OF THE INVENTION

It is an object of the present invention to provide an improved damascene interconnect structure that reduces parasitic capacitance between metal lines within the same metal layer (i.e., intra-layer capacitance).

It is a further object of the present invention to provide an improved damascene interconnect structure that reduces parasitic capacitance between the metal lines which are in adjacent metal layers (i.e., inter-layer capacitance).

It is yet a further object of the present invention to provide an improved damascene interconnect structure that provides a low effective dielectric constant.

It is yet another object of the present invention to provide an improved damascene interconnect structure that is easy to manufacture.

It is a further object of the present invention to provide a method of manufacturing an improved damascene interconnect structure that allows control of locations of air gaps.

It is yet another object of the present invention to provide an improved damascene interconnect structure that provides increased mechanical strength as compared to interconnect structures that employ porous materials.

It is yet a further object of the present invention to provide an improved damascene interconnect structure that provides increased thermal conductivity as compared to interconnect structures that employ porous materials.

It is a further object of the present invention to provide an improved damascene interconnect structure that provides a more stable dielectric constant than interconnect structures that employ porous materials.

These and other advantages will be apparent to those skilled in the art having reference to the specification in conjunction with the drawings and claims.

In order to accomplish the objects of the present invention, an improved damascene interconnect that reduces interconnect intra-layer capacitance and/or inter-layer capacitance is provided. The improved damascene interconnect structure has air gaps between metal lines and/or metal layers. The interconnect structure is fabricated to a via level through a processing step prior to forming contact vias, then one or more air gaps are formed into the damascene structure so that the air gaps are positioned between selected metal lines, or between selected metal layers, or between selected metal lines and selected metal layers. A sealing layer is then deposited over the damascene structure to seal the air gaps.

BRIEF DESCRIPTION OF THE DRAWINGS

The present invention is illustrated by way of example, and not by way of limitation, in the figures of the accompanying drawings. Corresponding numerals and symbols in the different figures refer to corresponding parts unless otherwise indicated.

FIGS. 1–18 are cross sectional views illustrating stages of fabrication of a single damascene interconnect structure according to one embodiment of the present invention.

FIGS. 19–37 are cross sectional views illustrating stages of fabrication of a single damascene interconnect structure according to a second embodiment of the present invention.

FIGS. 38–54 are cross sectional views illustrating stages of a "middle-first" or "embedded via mask" approach for fabrication of a dual damascene interconnect structure according to a third embodiment of the present invention.

FIGS. 55–66 are cross sectional views illustrating stages of a "trench-first" fabrication of a dual damascene interconnect structure according to a fourth embodiment of the present invention.

FIGS. 67–77 are cross sectional views illustrating stages of a "via-first" fabrication of a dual damascene interconnect structure according to a fifth embodiment of the present invention.

FIG. 78 is a top view of air gaps of the present invention having different shapes, sizes, and placement.

FIG. 79 is a cross-sectional view of an interconnect structure according to the present invention which reduces only intra-layer capacitance.

FIG. 80 is a cross-sectional view of an interconnect structure according to the present invention which reduces only inter-layer capacitance.

DETAILED DESCRIPTION OF THE PREFERRED EMBODIMENT

Figure 7:
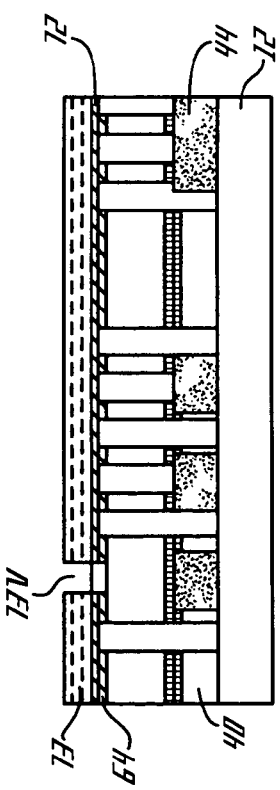

In the following detailed specification, numerous specific details are set forth, such as materials, thicknesses, processing sequences, etc., in order to provide a thorough understanding of the present invention. However, it will be apparent to one skilled in the art that the present invention may be practiced without these specific details. In certain instances, well-known semiconductor manufacturing processes, materials, and equipment have not been described in detail in order to avoid unnecessarily obscuring the present invention.

The invention will be described in conjunction with a two level metallization process. It will be apparent to those or ordinary skill in the art that the number of metallization levels may vary and that the invention is equally applicable to single level and multi-level devices.

The present invention is described in connection with damascene structures and the methods to manufacture them. The first embodiment and second embodiment illustrate two different approaches for forming two different single damascene structures.

The third, fourth, and fifth embodiments illustrate different fabrication methods for dual damascene structure. The third embodiment illustrates the processing steps for a "middle first" or "embedded via mask" dual damascene approach. The fourth embodiment illustrates the processing steps for a "trench first" dual damascene approach. The fifth embodiment illustrates the processing steps for a "via first" dual damascene approach. However, it will be understood by those of ordinary skill in the art, that the present invention can also be readily implemented into other processes and interconnect structures.

Single Damascene Structure: First Approach

FIG. 1 illustrates a structure at a particular point of processing. At this point, a first dielectric 40 has been deposited on a substrate 12; a first capping layer 52 has been deposited over first dielectric 40, and trenches have been formed in the first dielectric 40 and first capping layer 52. These trenches have been filled with a first metal (such as Cu, Al, W or their alloys and appropriate adhesion/barrier metals such as Ti, TiN, Ta, TaN, WN, TiSiN, TaSiN, WSiN, CoWP) to form metal lines 44. The dielectric layer 40 can be made of $SiO_2$ or low-k dielectrics. Depending on the dielectric material used for the first dielectric layer 40 and the metal used for the metal lines 44, the first capping layer 52 may not be needed. For example, if dielectric layer 40 is made of $SiO_2$, then the capping layer 52 is not needed. The first capping layer 52 can be made of, for example, $SiO_2$, doped silicon oxide, SiN, SiC, $Al_2O_3$. In a preferred embodiment, dielectric layer 40 is a low-k material and the first capping layer 52 is made of SiN. A second capping layer 56 has been deposited over the metal lines 44 and the first capping layer 52. The second capping layer 56 is required if the metal lines 44 are made of Cu, where it serves as a dielectric barrier layer for the Cu. As another example, if the metal lines 44 are made of Al, then the second capping layer 56 can be omitted. The second capping layer 56 can be made of $SiO_2$, doped silicon oxide, SiN, SiC, $Al_2O_3$. In a preferred embodiment, the metal lines 44 are made of Cu and the second capping layer is SiN. At this point, the structure is ready for the deposition of a second dielectric described hereinafter.

FIGS. 2–5 illustrate the formation of air gaps 68 of the present invention in the interconnect structure. The terms "air gap" and "air fillers" are used interchangeably herein and are intended to have the same meaning. Referring to FIG. 2, a second dielectric 60 is deposited over second capping layer 56. A third capping layer 64 is deposited over the second dielectric 60, which is also known as the via dielectric layer. Depending on the dielectric material used for the second dielectric layer 60, the third capping layer 64 may be omitted. The third capping layer 64 can be made of, for example, $SiO_2$, doped silicon oxide, SiN, SiC, $Al_2O_3$. In a preferred embodiment, the second dielectric layer 60 is a low-k material and the third capping layer 64 is made of $SiO_2$. A photoresist layer 66 is deposited, and an air gap pattern is transferred thereto by known lithography techniques.

First dielectric 40 and second dielectric 60 can be made from materials such as silicon oxide, or low dielectric constant (i.e., low-k) materials, such as, doped silicon oxide, silsesquioxanes, polyimides, fluorinated-polyimides, parylene, fluoro-polymers, poly(arylethers), fluorinated-poly(arylethers), porous-polymer/polyimide, polytetrafluoroethylene, porous silica (also known as Aerogel and Xerogel) and porous organic materials. The low dielectric material is deposited by using conventional techniques, such as spin-on deposition (SOD) or chemical vapor deposition (CVD), which vary depending on the specific low dielectric material used. As used herein, low-k means a dielectric constant of less than 4 for $SiO_2$. In addition, in one preferred embodiment, it is preferable that the first and second capping layers 52 and 56 are of the same material (e.g., $SiO_2$ or SiN), and that the third capping layer 64 has a material different from the material of the first and second capping layers 52 and 56.

By forming air gaps 68 in dielectric layers 40 and 60, the present invention reduces the effective dielectric constant of the structure. Air is desirable because it has the lowest dielectric constant (i.e., k=1).

Referring to FIG. 3, a first etch chemistry is utilized to etch through third capping layer 64 with patterned resist layer 66. For example, a carbon-fluoride (CF) based chemistry can be utilized to etch through the third capping layer 64 in a preferred embodiment if the third capping layer 64 is $SiO_2$. Once second dielectric 60 is reached, a new etch chemistry (i.e., a second etch chemistry) is introduced to etch through second dielectric 60. For example, when second dielectric 60 is an organic low-k material, an oxygen-based or hydrogen-based plasma etch can be utilized. This etch will simultaneously remove the photoresist 66, and will stop at the second capping layer 56.

Also referring to FIGS. 3–4, once second capping layer 56 is reached, a new etch chemistry (i.e., a third etch chemistry) is utilized to etch through second capping layer 56 and first capping layer 52. If there is no photoresist left to protect the third capping layer 64 during this etch, this etch must be selective to the capping layer 64 (i.e., the removal of the third capping layer 64 is none or very minimal during the etch). For example, in the preferred embodiment, a CF based chemistry that does not significantly attack the third capping layer 64 (e.g., $SiO_2$) can be utilized to etch the first and second capping layers 52 and 56 (which can be SiN).

Referring to FIG. 4, once first dielectric 40 is reached, a new etch chemistry (i.e., a fourth etch chemistry) is utilized to etch through first dielectric 40. This fourth etch chemistry is selective to the third capping layer 64 and the exposed metal lines 44. For example, when first dielectric 40 is an organic low-k material, an oxygen-based or hydrogen-based plasma etch can be utilized, which does not etch the third capping layer 64 and metal lines 44. The oxygen chemistry may cause surface oxidation of the exposed metal (e.g., Cu) lines 44 at exposed locations. However, after this etch step, a hydrogen based gas can be introduced to treat the wafer and to reduce the oxidized Cu back to pure Cu so as to maintain interconnect line integrity. At this time, air gaps 68 are formed in dielectric layers 40 and 60 as shown in FIG. 5.

Referring to FIG. 6, a sealing layer 72 is deposited to seal the air gaps 68. The word "seal", as used herein, can mean sealing air gaps 68 without filling air gaps 68 with any of the material used in sealing layer 72 or sealing air gaps 68 and only partially filling air gaps 68 with the material of sealing layer 72. The sealing layer can be made of $SiO_2$, doped silicon oxide, SiN, SiC, $Al_2O_3$, the low-k materials listed above, and other organic or inorganic dielectric materials. The sealing layer can be deposited by SOD or CVD, which vary depending on the specific material used. In a preferred embodiment, sealing layer 72a is silicon-oxide based material deposited by SOD.

Figure 8:
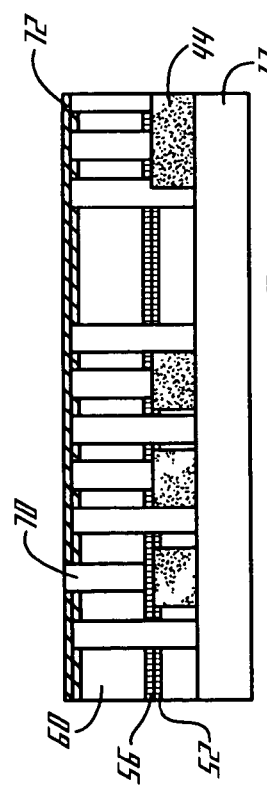
Figure 9:
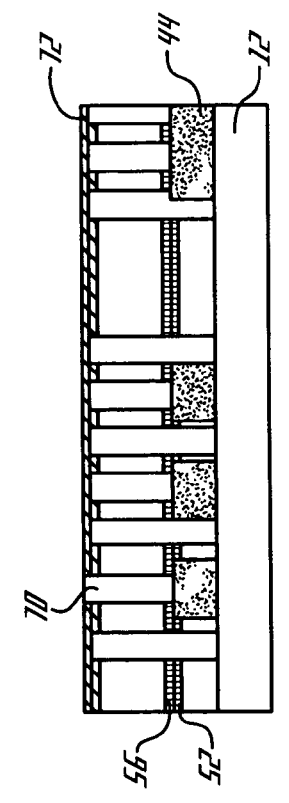

FIGS. 7–9 illustrate the formation of a via in the interconnect structure. Referring to FIG. 7, a resist 73 is deposited, and a via pattern 73V is transferred thereto by known lithography techniques. A first etch chemistry is utilized to etch through sealing layer 72 and third capping layer 64. For example, in the preferred embodiment, a carbon-fluoride-based chemistry can be utilized to etch through the sealing layer 72 and third capping layer 64 (both 72 and 64 are silicon oxide based material in a preferred embodiment).

Also referring to FIG. 7, once second dielectric 60 is reached, a new etch chemistry (i.e., a second etch chemistry) is introduced to etch through second dielectric 60. For example, in the preferred embodiment where second dielectric 60 is an organic low-k material, an oxygen-based or hydrogen based plasma etch can be utilized. The resist layer 73 is removed at the same time. If there is any resist 73 left from the etch using the second chemistry, an oxygen-based etch chemistry can be used to remove the resist 73 at this point.

Referring to FIG. 8, once second capping layer 56 is reached at the via holes 70, a new etch chemistry (i.e., a third etch chemistry) is utilized to etch through second capping layer 56 without etching or with minimal etching of the sealing layer 72. For example, in the preferred embodiment, a CF based chemistry that does not significantly attack the sealing layer 72 can be utilized to etch the second capping layer 56 (e.g., SiN) if the sealing layer 72 is silicon-oxide based material. The etch stops at metal lines 44, so that a via hole 70 is fabricated within the second dielectric layer 60, as shown in FIG. 9.

Figure 10:
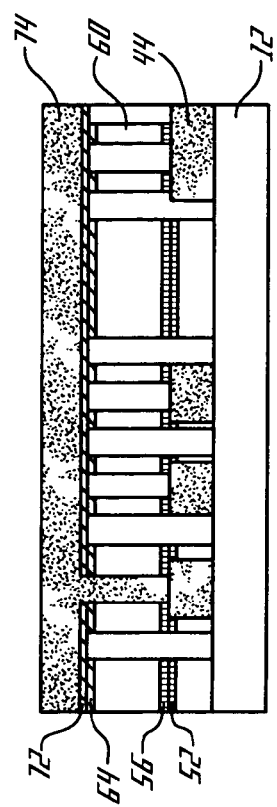
Figure 11:
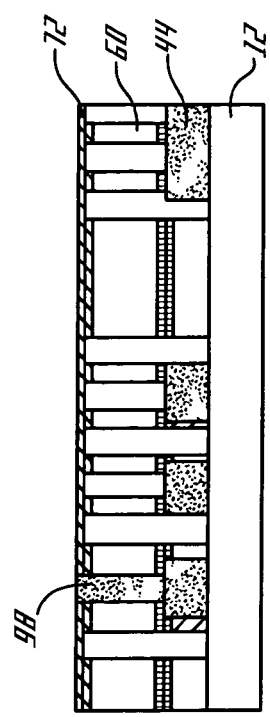
Figure 12:
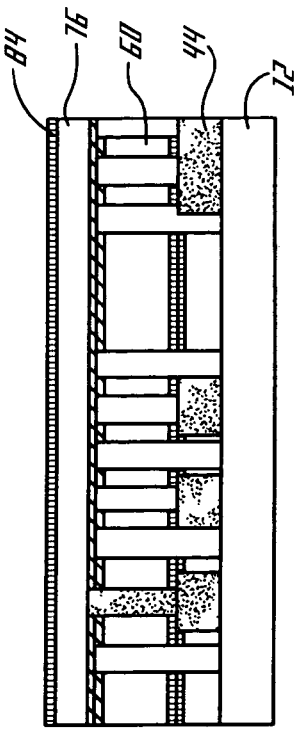

Referring to FIG. 10, a conductive material 74 (e.g., Cu, Al, tungsten) is deposited to fill the via holes 70 by known techniques such as physical vapor deposition (PVD), electroplating, or CVD. Appropriate adhesion/barrier layers (identified above) and seed layers (such as Cu seed for Cu electroplating) can be deposited before the bulk metal deposition. Referring to FIG. 11, excess conductive material 74 is removed to form conductive plug 98 by known techniques such as chemical mechanical polishing or etchback. Referring to FIG. 12, a third or trench dielectric 76 is deposited over conductive plug 98 and sealing layer 72. Thereafter, a fourth capping layer 84 is deposited over the third dielectric 76. The third dielectric 76 can be made from the materials listed for second dielectric 60 and the fourth capping layer 84 can be made from the materials listed for the first capping layer 52. Depending on the dielectric material 76, the fourth capping layer 84 may be omitted. In the preferred embodiment, third dielectric 76 is an organic low-k material and fourth capping layer 84 is SiN.

Referring to FIG. 13, a photoresist layer 89 is deposited over fourth capping layer 84, and a pattern for a second metal layer is transferred thereto by known lithography techniques.

Referring to FIGS. 13 and 14, a first etch chemistry is utilized to etch through fourth capping layer 84, by using, for example, a CF based chemistry, if the fourth capping layer 84 is SiN.

Referring to FIG. 14, once third dielectric 76 is reached, a new etch chemistry (i.e., a second etch chemistry) is introduced to etch through third dielectric 76. For example, when third dielectric 76 is an organic low-k material, an oxygen-based or hydrogen-based plasma etch can be utilized. During this etch, photoresist layer 89 is removed at the same time. This etch continues until it reaches sealing layer 72 and metal plug 98 as shown in FIG. 15.

Referring to FIG. 16, a second metal layer 100 is deposited. The metal layers 100 and 44 can be of the same material. Appropriate adhesion/barrier layers (identified above) and seed layers can be deposited before the bulk metal deposition. Referring to FIG. 17, second metal layer 100 is polished back so that its top surface is about planar with the top surface of fourth capping layer 84. Referring to FIG. 18, a fifth capping layer 104 is deposited over the second metal 100 and fourth capping layer 84. The fifth capping layer 104 can be made of the same material as the second capping layer 56.

It can be seen that first capping layer 52 functions to cap or protect first dielectric 40 (if dielectric 40 is an organic low-k material) during etching. Similarly, second capping layer 56 protects or caps metal lines 44, and third capping layer 64 protects or caps second dielectric 60. The fourth capping layer 84 caps or protects the third dielectric, and the fifth capping layer 104 caps or protects the metal layer 100.

Single Damascene Structure: Second Approach

FIGS. 19–23 correspond generally to FIGS. 1–5. Accordingly, for the sake of brevity, the description of FIGS. 19–23 related to the formation of air gaps 68A will not be repeated herein. Instead, reference is made to the description of FIGS. 1–5, and differences between the first and second embodiments are highlighted herein. It is noted that elements common between the first and second embodiment are denoted by the same numeral with the addition of a label "A".

One difference between the first and second embodiments is the deposition of an additional SiN layer 75 and an additional SiO$_2$ layer 77, although other material combinations are also possible. The SiN layer 75 remains in the final structure as illustrated in FIG. 37. The addition of SiN layer 75 and SiO$_2$ layer 77 eases certain processing requirements for subsequent process steps. Specifically, the addition of SiN layer 75 and SiO$_2$ layer 77 have several advantages over the first embodiment, as explained below.

Referring to FIG. 24, a sealing layer 72A is deposited over third capping layer 64A to seal air gaps 68A. Next, an SiN layer 75 is deposited over sealing layer 72A. Thereafter, an SiO$_2$ layer 77 is deposited over the SiN layer 75.

Referring to FIG. 25, a photoresist 73A is deposited, and a via pattern is transferred thereto. A first etch chemistry with similar etch rate for SiO$_2$ and SiN is utilized to etch through SiO$_2$ layer 77 and SiN layer 75. For example, a CF based chemistry can be utilized. Once sealing layer 72A is reached, a new etch chemistry (i.e., a second etch chemistry) can be utilized to etch through sealing layer 72A and third capping layer 64A.

FIGS. 26–28 correspond generally to FIGS. 8–10. Accordingly, for the sake of brevity, the description of FIGS. 26–28 related to etching a via 70A through via dielectric 60A and second capping layer 56A, and depositing a conductive material 74A into the via 70A, will not be repeated herein. Instead, reference is made to the description of FIGS. 8–10. However, it should be noted that during the etch of second capping layer 56A, SiO$_2$ layer 77 serves as an etch protection layer since photoresist 73A has been removed during the etch of second dielectric 60A (which can be an organic low-k material).

Referring to FIG. 29, the conductive material 74A is polished or etched back to form conductive plug 98A. After polishing or etch-back, the SiO$_2$ layer 77 is exposed.

Referring to FIG. 30, a polish or buffing step is utilized to remove the SiO$_2$ layer 77, thereby exposing the SiN layer 75. The SiN layer 75 acts as a good polish stop layer. The removal of SiO$_2$ layer 77 is advantageous because the SiO$_2$ layer 77 often contains unwanted contaminants from previous processing steps that can affect reliability of the interconnect.

Referring to FIG. 31, which corresponds generally to FIG. 12 of the first embodiment, a third dielectric 76A is deposited over the SiN layer 75. Thereafter, a fourth capping layer 84A is deposited over third dielectric 76A.

FIGS. 32–37 correspond generally to FIGS. 13–18. Accordingly, for the sake of brevity, the description of FIGS. 32–37 related to etching a second metal layer trench pattern through capping layer 84A and third dielectric 76A, and depositing the second metal layer 100A, will not be repeated herein. Instead, reference is made to the description of FIGS. 13–18. However, it should be noted that, during the trench etch, SiN layer 75 serves as an etch stop layer (instead of the sealing layer 72 as in the first embodiment). This can be seen by comparing FIGS. 15 and 34.

Dual Damascene Structure: "Middle First" Approach

FIGS. 38–54 are cross sectional views illustrating stages of a "middle-first" fabrication of a dual damascene interconnect structure according to a third embodiment of the present invention.

FIGS. 38–44 correspond generally to FIGS. 1–7. Accordingly, for the sake of brevity, the description of FIGS. 38–44 related to the formation of air gaps 68B and the etching of a via pattern into sealing layer 72B and third capping layer 64B will not be repeated herein. Instead, reference is made to the description of FIGS. 1–7, and differences between the first and third embodiments are highlighted herein. It is noted that elements common between the first and second embodiment are denoted by the same numeral with the addition of a label "B".

Referring to FIG. 45, instead of etching through second dielectric 60 as illustrated in FIG. 8 of the first embodiment, the third embodiment removes the resist layer 73B, then deposits a third dielectric 76B, followed by a fourth capping layer 84B (e.g., SiN) and a fifth capping (e.g. SiO$_2$) layer 85. In addition, this embodiment utilizes the fifth capping layer 85 which is not used in the first embodiment.

Referring to FIG. 46, a resist layer 89B is deposited and a pattern for a second metal level is transferred thereto. Referring to FIG. 47, capping layers 85 and 84B are etched in accordance with the patterned resist using, for example, CF based chemistry as described above. A single chemistry or two different chemistries can be utilized for this etch step.

Referring now to FIG. 48, the chemistry is changed and the third dielectric 76B is etched. If third dielectric 76B is an organic low-k material, oxygen-based or hydrogen-based chemistry can be used for the etch. At the same time, the oxygen-based plasma or hydrogen-based plasma removes resist 89B. At this time, it should be noted that sealing layer 72B protects third capping layer 64B and second dielectric 60B during subsequent etching, and that capping layers 85 and 84B protect dielectric 76B from being etched away.

Referring to FIG. 49, via 70B is etched throughout the second dielectric 60B to second capping layer 56B. Referring to FIG. 50, the chemistry is changed and the layer 56B is etched. At this point, it should be noted that layers 85 and 72B protect all other portions of the structure when the second capping layer 56B is etched.

FIGS. 51–53 illustrate the formation of a conductive plug in the via 70B and the formation of a second metal layer 100B. Referring to FIG. 51, a metal stack (e.g., Cu, Al, W, Ti, TiN, Ta, TaN, etc.) 100B is deposited to fill the via 70B and the trench. Referring to FIG. 52, excess metal 100B over the trench is removed and polished away so that the second metal layer is planar with the top surface of the capping layer 85. Referring to FIG. 53, the capping layer 85 and part of the second metal layer 100B are removed together so that the second metal layer 100B is planar with the top surface of capping layer 84B (this step is optional). The advantage of removing capping layer 85 (of $SiO_2$) is to remove the contamination and damage in the layer 85 in the same manner as for layer 77 in the second embodiment. Referring to FIG. 54, another capping layer 104B is deposited over the capping layer 84B and the second metal layer 100B using a similar method as described in the first embodiment.

Dual Damascene Structure: "Trench First" Approach

FIGS. 55–66 are cross sectional views illustrating stages of a "trench-first" fabrication of a dual damascene interconnect structure according to a fourth embodiment of the present invention.

FIG. 55 corresponds generally to FIG. 43, and FIGS. 61–66 correspond generally to FIGS. 49–54. Accordingly, for the sake of brevity, the description of these figures related to filling the vias 70C with a conductive plug, and to the formation of the second metal level 100C, will not be repeated herein. Instead, reference is made to the description of FIGS. 43, 49–54, and differences between the third and fourth embodiments that are highlighted herein. It is noted that elements common between the third and fourth embodiment are denoted by the same numeral with the addition of a label "C".

It is noted that the structure as shown in FIG. 55 can be manufactured as illustrated in FIGS. 38–43 of the third embodiment. The formation of air gaps 68C of the present invention occur prior to processing illustrated in FIG. 55.

Referring to FIG. 56, instead of etching through layers 72C and 64C with a via pattern, as shown in FIG. 44 of the third embodiment, the fourth embodiment, in contrast, deposits the third dielectric 76C, followed by capping layers 84C and 85C. A resist layer 89C is deposited and then a pattern for the trench is transferred thereto.

Referring to FIG. 57, the capping layers 85C and 84C are etched to expose the third dielectric 76C. Referring to FIG. 58, trenches are etched into the third dielectric 76C, and the sealing layer 72C serves as an etch stop layer. During this etch, photoresist layer 89C can be removed simultaneously if third dielectric 76C is an organic low-k material. Therefore, as seen in FIGS. 56–58, instead of etching the "middle" first in accordance with the third embodiment, the fourth embodiment etches the "trench" first. Referring now to FIG. 59, a resist layer 91 is deposited and a pattern 73V for a via 70C is transferred thereto. Referring to FIG. 60, the via pattern is etched into the layers 72C and 64C to the second dielectric 60C by utilizing a first chemistry. Referring now to FIG. 61, the chemistry is changed to continue to etch via 70C into the second dielectric 60C to the layer 56C, and to simultaneously remove the resist layer 91. Referring to FIG. 62, the chemistry is again changed to etch the layer 56C to expose metal line 44C at the bottom of the via 70C. This etch chemistry is selective to layers 85C and 72C. As noted previously, FIGS. 63–66 have been described previously with respect to the third embodiment. FIG. 66 illustrates the final structure which is the same as that shown in FIG. 54.

Dual Damascene Structure: "Via First" Approach

FIGS. 67–77 are cross sectional views illustrating stages of a "via-first" fabrication of a dual damascene interconnect structure according to a fifth embodiment of the present invention.

FIG. 67 corresponds generally to FIG. 43, and FIGS. 76–77 correspond generally to FIGS. 50 and 54. Accordingly, for the sake of brevity, the description of these figures related to filling the vias 70D with a conductive plug, and to the formation of the second metal level 100D, will not be repeated herein. Instead, reference is made to the description of FIGS. 43, 50–54, and the differences between the third and fifth embodiments that are highlighted herein. It is noted that elements common between the third and fifth embodiment are denoted by the same numeral with the addition of a label "D".

It is noted that the structure as shown in FIG. 67 can be manufactured as illustrated in FIGS. 38–43 of the third embodiment. The formation of air gaps 68D of the present invention occur prior to processing illustrated in FIG. 67.

Referring to FIG. 68, instead of etching through layers 72D and 64D with a via pattern, as shown in FIG. 44 of the third embodiment, in the fifth embodiment, a third dielectric 76D is deposited, followed by capping layers 84D, 85D, and 86. Non limiting examples of the materials that can be used for the layers 84D, 85D and 86 are SiN, $SiO_2$ and SiN, respectively. A resist 93 is deposited and a via pattern 73V is printed thereto by known lithography techniques. Referring to FIG. 69, the via pattern is etched into the capping layers 86, 85D and 84D to the third dielectric layer 76D by utilizing a single or multiple etch chemistries. Referring to FIG. 70, the chemistry is changed, and the via pattern is etched into the third dielectric layer 76D to sealing layer 72D, and the resist 93 can be removed at the same time using the same etch chemistry. Referring to FIG. 71, the etch chemistry is again changed, and the sealing layer 72D and layer 64D are etched. In a preferred embodiment, the layer 86 (e.g., SiN) serves as an etch protection layer when the layers 72D and 64D (both being silicon oxide based) are etched at the via. Referring to FIG. 72, the chemistry is changed, and the second dielectric layer 60D is etched to capping layer 56D to create a via 70D. Referring to FIG. 73, a resist 89D is deposited and a trench pattern for the second metal layer 100D is transferred thereto. Referring to FIG. 74, a single or multiple chemistries are utilized to etch the trench pattern in layers 86, 85D, 84D. Referring to FIG. 75, the etch chemistry is changed to etch the trench in third dielectric layer 76D and to remove the resist 89D. Layer 72D and layer 86 serve as the etch stop layer and the etch protection layer, respectively, for this etch step. In FIG. 76, the chemistry is changed to etch layer 56D at the bottom of the via 70D, and at the same time, layer 86 is etched away if layers 56D and 86 are the same material (e.g., SiN). During this etch, the layers 85D and 72D protect the other portions of the interconnect structure. The process then proceeds in the same manner as described in connection with FIGS. 50–54, to reach FIG. 77 (which is the same as FIG. 54).

FIG. 78 is a top view of various shapes and placements of the air gaps of the present invention. A first interconnect line 870, a second interconnect line 874, a third interconnect line 878, and a fourth interconnect line 882 are illustrated with air gaps 886 disposed between. For example, a square air gap 886A, two circle air gaps 886B, and an L-shaped air gap 886C are provided between first interconnect line 870 and second interconnect line 874 to reduce the capacitance therebetween. Moreover, two rectangular air gaps 886D are provided between second interconnect line 874 and third interconnect line 878 to reduce the capacitance therebetween. Furthermore, an oval air gap 886E is provided between third interconnect line 878 and fourth interconnect line 882 to reduce the capacitance therebetween. A rectangular air gap 886F and another rectangular air gap 886G are formed to the right of third interconnect line 878 to reduce the capacitance between the third interconnect line 878 and interconnect lines (not shown) to the right of third interconnect line 878. Similarly, a rectangular air gap 886H is formed to the left of first interconnect line 870 to reduce the capacitance between the first interconnect line 870 and interconnect lines (not shown) to the left of first interconnect line 870.

As is evident in FIG. 78, the shape, size and placement of the air gaps of the present invention can vary from application to application for different circuits. For example, the top view of the air gaps can be any shape, such as in the shape of a circle, oval, square, rectangle, etc. The air gap can follow an interconnect line, such as the corner-shaped air gap 886C that follows a turn of an interconnect line. Air gaps can exist directly next to a interconnect line (as shown by 886F) or can be separated from a interconnect line by a dielectric.

FIG. 79 is a sectional view of an interconnect structure 900 that reduces intra-layer capacitance. It is noted that air gaps 902 are formed only between interconnect lines, and not between interconnect layers. For example, whereas air gaps 902 are shown between interconnect lines 904A and 904B, between interconnect lines 904B and 904C, and between interconnect lines 904C and 904D, no air gaps are shown between the first interconnect layer 906 and the second interconnect layer 908.

FIG. 80 is a sectional view of an interconnect structure 950 that reduces inter-layer capacitance. It is noted that air gaps 952 are formed only between interconnect layers, and not between interconnect lines. For example, whereas air gaps 952 are shown between interconnect layers 954 and 956 no air gaps are shown between the interconnect lines 958A–958D. The interconnect structures 900 and 952 in FIGS. 79 and 80 can be fabricated according to any of the methods illustrated above.

The present invention has been described both in terms of device structure and method of fabrication. An advantage of this novel structure is in the use of air trenches or gaps to lower the effective dielectric constant of the structure. The air trenches are employed in locations where the advantages of low dielectric constant will be realized the most, while avoiding the negative effects to the structure in terms of mechanical strength and thermal conductivity by maintaining pillars of support that are made of dielectric material.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

Furthermore, details on the structure and for fabricating the structure as provided here, may vary and may or may not be necessary depending on the actual materials chosen for each portion of the structure and known strengths and limitations in processing such materials. Other details that have not been provided are those that are known or ascertainable by persons ordinarily skilled in the art, and so have been purposely omitted so as to not obscure the description of the invention. It is intended that substitutions and alternations to the structure or method of the invention can be made without departing from the spirit and scope of the invention as defined by the claims below.

What is claimed is:

1. A method for fabricating a damascene interconnect structure having one or more air trenches and a plurality of spaced-apart metal lines comprising:
   (a) fabricating the damascene structure to a via level through a processing step prior to forming contact vias, wherein step (a) comprises:
      depositing a first dielectric layer;
      depositing a first capping layer over the first dielectric layer;
      forming a plurality of trenches in the first capping layer and the first dielectric layer;
      filling the plurality of trenches with metal to form the plurality of spaced-apart-metal lines, wherein the plurality of spaced-apart metal lines are situated in the first capping layer and the first dielectric layer;
      depositing a second capping layer directly on the first capping layer; and
      depositing a second dielectric layer over the second capping layer;
   (b) etching one or more air trenches into the damascene structure so that the air trenches are positioned over selected metal lines, wherein the one or more air trenches are not etched into the first dielectric layer and the first capping layer, wherein the second capping layer is situated over the selected metal lines; and
   (c) depositing a sealing layer over the damascene structure having air trenches to seal the air trenches.

2. The method of claim 1, wherein step (a) further includes
   depositing a third capping layer over the second dielectric layer.

3. The method of claim 2, further including:
   etching an air trench in the first and second dielectric layers, and the first, second and third capping layers.

4. The method of claim 1, further including:
   forming a via in the sealing layer and the damascene structure; forming a metal plug in the via;
   forming a trench over the sealing layer; and forming a conductive layer in the trench.

5. The method of claim 1, further including:
   depositing an etch stop layer over the sealing layer;
   forming a via in the etch stop layer, the sealing layer and the damascene structure;
   forming a metal plug in the via;
   forming a trench over the etch stop layer; and forming a conductive layer in the trench.

6. The method of claim 1, further including:
   forming a via in the sealing layer;
   forming a trench over the sealing layer;
   forming a via in the damascene structure; and forming a conductive layer in the trench.

7. The method of claim 1, further including:
forming a trench over the sealing layer;
forming a via in the sealing layer and the damascene structure; and forming a conductive layer in the trench.

8. The method of claim 1, further including:
forming a via in the sealing layer and the damascene structure; forming a trench over the sealing layer; and forming a conductive layer in the trench.

9. A method for fabricating a damascene interconnect structure having one or more air trenches and a plurality of spaced-apart metal lines comprising:
(a) fabricating the damascene structure to a via level through a processing step prior to forming contact vias, wherein step (a) comprises:
depositing a first dielectric layer;
depositing a first capping layer over the first dielectric layer;
forming a plurality of trenches in the first capping layer and the first dielectric layer;
filling the plurality of trenches with metal to form the plurality of spaced-apart metal lines, wherein the plurality of spaced-apart metal lines are situated in the first capping layer and the first dielectric layer;
depositing a second capping layer directly on the first capping layer and over the plurality of spaced-apart metal lines; and
depositing a second dielectric layer over the second capping layer;
(b) etching one or more air trenches into the damascene structure so that the air trenches are positioned over selected metal lines, wherein the one or more air trenches are not etched into the first dielectric layer and the first capping layer;
(c) depositing a sealing layer over the damascene structure having air trenches to seal the air trenches;
(d) depositing a polish stop layer over the sealing layer; and
(e) depositing an etch stop layer directly on the polish stop layer.

10. The method of claim 9, wherein step (a) further includes
depositing a third capping layer over the second dielectric layer.

11. The method of claim 10, further including:
etching an air trench in the first and second dielectric layers, and the first, second and third capping layers.

12. The method of claim 9, further including:
forming a via in the sealing layer and the damascene structure; forming a metal plug in the via;
forming a trench over the sealing layer; and forming a conductive layer in the trench.

13. The method of claim 9, further including:
forming a via in the etch stop layer, the sealing layer and the damascene structure;
forming a metal plug in the via;
forming a trench over the etch stop layer; and forming a conductive layer in the trench.

14. The method of claim 9, further including:
forming a via in the sealing layer;
forming a trench over the sealing layer;
forming a via in the damascene structure; and forming a conductive layer in the trench.

15. The method of claim 9, further including:
forming a trench over the sealing layer;
forming a via in the sealing layer and the damascene structure; and forming a conductive layer in the trench.

16. The method of claim 9, further including:
forming a via in the sealing layer and the damascene structure; forming a trench over the sealing layer; and forming a conductive layer in the trench.

17. A method for fabricating a damascene interconnect structure having one or more air trenches and a plurality of spaced-apart metal lines comprising:
(a) fabricating the damascene structure to a via level through a processing step prior to forming contact vias, wherein step (a) comprises:
depositing a first dielectric layer;
depositing a first capping layer over the first dielectric layer;
forming a plurality of trenches in the first capping layer and the first dielectric layer;
filling the plurality of trenches with metal to form the plurality of spaced-apart metal lines, wherein the plurality of spaced-apart metal lines are situated in the first capping layer and the first dielectric layer;
depositing a second capping layer directly on the first capping layer and over the plurality of spaced-apart metal lines;
depositing a second dielectric layer over the second capping layer; and
depositing a third capping layer over the second dielectric layer;
(b) etching one or more air trenches into the damascene structure so that the air trenches are positioned over selected metal lines, wherein the one or more air trenches are not etched into the first dielectric layer and the first capping layer;
(c) depositing a sealing layer over the damascene structure having air trenches to seal the air trenches; and
(d) depositing a polish stop layer over the sealing layer.

18. The method of claim 17, further including:
etching an air trench in the first and second dielectric layers, and the first, second and third capping layers.

* * * * *

UNITED STATES PATENT AND TRADEMARK OFFICE
CERTIFICATE OF CORRECTION

PATENT NO. : 6,984,577 B1  Page 1 of 1
APPLICATION NO. : 09/665422
DATED : January 10, 2006
INVENTOR(S) : Zhao et al.

It is certified that error appears in the above-identified patent and that said Letters Patent is hereby corrected as shown below:

In the claims, column 12, line 28, "spaced-apart-metal lines" should be changed to --spaced-apart metal lines--.

Signed and Sealed this

Fifteenth Day of July, 2008

JON W. DUDAS
*Director of the United States Patent and Trademark Office*